(12) United States Patent
Maeda et al.

(10) Patent No.: US 12,529,953 B2
(45) Date of Patent: *Jan. 20, 2026

(54) MASK BLANK, PHASE SHIFT MASK, AND METHOD OF MANUFACTURING SEMICONDUCTOR DEVICE

(71) Applicant: HOYA CORPORATION, Tokyo (JP)

(72) Inventors: Hitoshi Maeda, Tokyo (JP); Osamu Nozawa, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 508 days.

This patent is subject to a terminal disclaimer.

(21) Appl. No.: 18/114,452

(22) Filed: Feb. 27, 2023

(65) Prior Publication Data

US 2023/0314929 A1 Oct. 5, 2023

(30) Foreign Application Priority Data

Mar. 31, 2022 (JP) .................. 2022-057867

(51) Int. Cl.
*G03F 1/32* (2012.01)
*G03F 1/54* (2012.01)

(52) U.S. Cl.
CPC . *G03F 1/32* (2013.01); *G03F 1/54* (2013.01)

(58) Field of Classification Search
CPC ................ G03F 1/32; G03F 1/54; G03F 1/26
See application file for complete search history.

(56) References Cited

U.S. PATENT DOCUMENTS

| | | | |
|---|---|---|---|
| 2003/0180631 A1* | 9/2003 | Shiota | G03F 1/32 428/432 |
| 2009/0233182 A1* | 9/2009 | Yamada | G03F 1/54 430/5 |
| 2018/0210331 A1* | 7/2018 | Kajiwara | G03F 1/32 |
| 2024/0184194 A1* | 6/2024 | Maeda | G03F 1/32 |

FOREIGN PATENT DOCUMENTS

| | | | |
|---|---|---|---|
| JP | H07325384 A | 12/1995 | |
| JP | H08171197 A | 7/1996 | |

* cited by examiner

*Primary Examiner* — Stewart A Fraser
(74) *Attorney, Agent, or Firm* — Sughrue Mion, PLLC

(57) ABSTRACT

A mask blank comprises: a light-transmissive substrate; and a phase shift film formed on the light-transmissive substrate, in which the phase shift film includes a lower layer containing hafnium and oxygen and an upper layer formed on the lower layer and containing silicon, oxygen, and nitrogen, a total content of hafnium and oxygen in the lower layer is 95 atom % or more, and a content of nitrogen in the upper layer is 15 atom % or more.

19 Claims, 2 Drawing Sheets

FIG. 3A
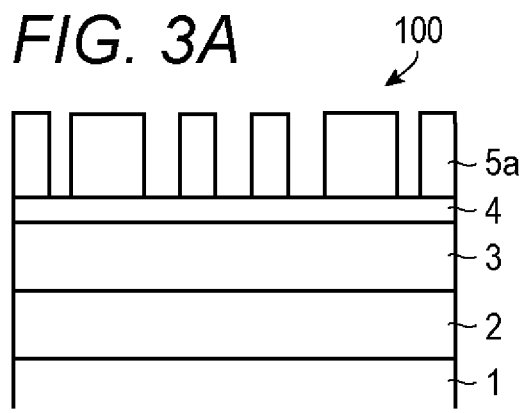
FIG. 3B
FIG. 3C
FIG. 3D
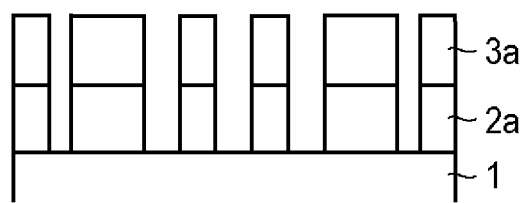
FIG. 3E
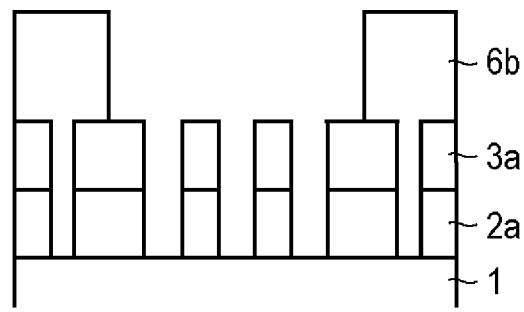
FIG. 3F
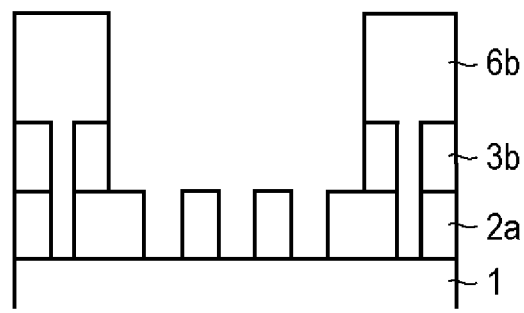
FIG. 3G
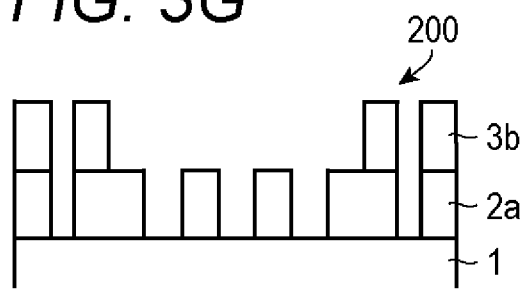

MASK BLANK, PHASE SHIFT MASK, AND METHOD OF MANUFACTURING SEMICONDUCTOR DEVICE

CROSS-REFERENCE TO RELATED APPLICATIONS

This application claims Japanese Patent Application No. 2022-057867, filed Mar. 31, 2022, the entire contents of which are hereby incorporated by reference in their entirety.

BACKGROUND

Technical Field

The present disclosure relates to a mask blank for a phase shift mask, a phase shift mask, and a method of manufacturing a semiconductor device.

Related Art

In a manufacturing process of a semiconductor device, a fine pattern is formed using a photolithography method. In addition, many transfer masks are usually used for forming the fine pattern. In order to miniaturize the pattern of the semiconductor device, it is necessary to miniaturize the mask pattern formed on the transfer mask and to shorten the wavelength of an exposure light source used in photolithography.

As such a photomask, JP H07-325384 A discloses a dielectric mask including a light-transmissive substrate 1 through which laser light can pass, a metal film 17 layered on a surface of the light-transmissive substrate 1 and having high reflectance to laser light, a dielectric multilayer thin film 4 formed by alternately layering first and second dielectric members 2 and 3 having different refractive indexes on the metal film 17, and a plurality of openings 18 that are formed through the dielectric multilayer thin film 4 and the metal film 17 and arranged in a predetermined pattern. In addition, JP H08-171197 A discloses a mask for excimer laser processing having a structure in which a third dielectric layer 1' is provided on the uppermost layer of a dielectric multilayer film obtained by repeatedly forming a combination of bilayer films obtained by building up a first dielectric layer 1 and a second dielectric layer 2 on a surface of a glass substrate 3 opposite to the ultraviolet light incident side and a metal film 4 is provided on the uppermost layer, the glass substrate 3 being transparent to ultraviolet light, the first dielectric layer 1 having a film thickness with an optical path length of ¼ wavelength of ultraviolet rays to be used, the second dielectric layer 2 having an optical path length of ¼ wavelength and a refractive index smaller than that of the first dielectric layer, the third dielectric layer 1' having a refractive index larger than the refractive index of the glass substrate and having an optical path length of ¼ wavelength of ultraviolet rays to be used.

In JP H07-325384 A and JP H08-171197 A, a KrF excimer laser (wavelength: 248 nm) is mainly applied as an exposure light source for manufacturing a semiconductor device. However, in recent years, an ArF excimer laser (wavelength: 193 nm) has been increasingly applied to an exposure light source for manufacturing a semiconductor device.

One type of transfer mask is a halftone phase shift mask. As a mask blank for a halftone phase shift mask, there has been known a mask blank having a structure in which a phase shift film made of a material containing silicon and nitrogen, a light-shielding film made of a chromium-based material, and an etching mask film (hard mask film) made of an inorganic material are layered on a light-transmissive substrate. When a halftone phase shift mask is manufactured using this mask blank, first, an etching mask film is patterned by dry etching with a fluorine-based gas using a resist pattern formed on a surface of the mask blank as a mask, then a light-shielding film is patterned by dry etching with a mixed gas of chlorine and oxygen using the etching mask film as a mask, and further, a phase shift film is patterned by dry etching with a fluorine-based gas using the pattern of the light-shielding film as a mask.

SUMMARY

A mask blank according to an embodiment of the present disclosure comprises: a light-transmissive substrate; and a phase shift film formed on the light-transmissive substrate, in which the phase shift film includes a lower layer containing hafnium and oxygen and an upper layer formed on the lower layer and containing silicon, oxygen, and nitrogen, a total content of hafnium and oxygen in the lower layer is 95 atom % or more, and a content of nitrogen in the upper layer is 15 atom % or more.

BRIEF DESCRIPTION OF DRAWINGS

FIGS. 3A to 3G are schematic cross-sectional views illustrating a manufacturing process of a phase shift mask of the first and second embodiments.

DETAILED DESCRIPTION

Figure 1:
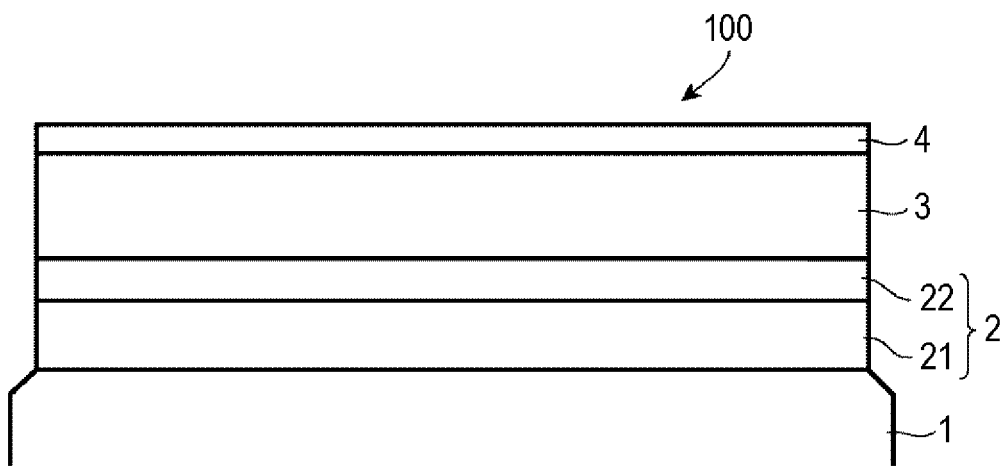
FIG. 1 is a schematic cross-sectional view of a mask blank according to a first embodiment.

With miniaturization and complication of patterns in recent years, in order to enable pattern transfer with higher resolution, a phase shift film with higher transmittance (for example, 20% or more) to exposure light (in particular, exposure light of an ArF excimer laser) is expected. By increasing the transmittance to the exposure light, the phase shift effect can be enhanced. With miniaturization (for example, to 20 nm or less) or the like of the patterns, from the viewpoint of restraining pattern collapse or the like, it may be expected to keep the film thickness of the phase shift film to a certain value or less (for example, to 60 nm or less).

The present disclosure has been made to solve the problems, and an aspect of the present disclosure is to provide a mask blank that allows manufacturing of a phase shift mask capable of increasing transmittance to exposure light to enhance a phase shift effect, controlling the film thickness of a phase shift film not to be large, forming a fine pattern, and having favorable optical performance. In addition, an aspect of the present disclosure is to provide a phase shift mask capable of increasing transmittance to the exposure light to enhance a phase shift effect, controlling the film thickness of a phase shift film not to be large, forming a fine pattern, and having favorable optical performance. The present disclosure provides a method of manufacturing a semiconductor device using such a phase shift mask.

The present disclosure can have the following configurations as means for solving the above problems.

(Configuration 1)

A Mask Blank Comprising:

a light-transmissive substrate and a phase shift film formed on the light-transmissive substrate, in which
the phase shift film includes
a lower layer containing hafnium and oxygen and
an upper layer formed on the lower layer and containing silicon, oxygen, and nitrogen,
a total content of hafnium and oxygen in the lower layer is 95 atom % or more, and
a content of nitrogen in the upper layer is 15 atom % or more.

(Configuration 2)
The mask blank according to configuration 1, in which a content of oxygen in the upper layer is 50 atom % or less.

(Configuration 3)
The mask blank according to configuration 1 or 2, wherein a content of oxygen in the lower layer is 50 atom % or more.

(Configuration 4)
The mask blank according to any one of configurations 1 to 3, in which a content of nitrogen in the upper layer is 60 atom % or less.

(Configuration 5)
The mask blank according to any one of configurations 1 to 4, in which
the phase shift film includes an intermediate layer formed between the lower layer and the upper layer, and
the intermediate layer consists of a material having a total content of silicon and oxygen of 90 atom % or more.

(Configuration 6)
The mask blank according to configuration 5, in which the intermediate layer consists of silicon and oxygen.

(Configuration 7)
The mask blank according to any one of configurations 1 to 6, in which the film thickness of the phase shift film is 60 nm or less.

(Configuration 8)
The mask blank according to any one of configurations 1 to 7, in which the phase shift film has a transmittance of 20% or more and a phase shift amount of 150 degrees or more and 210 degrees or less with respect to exposure light of an ArF excimer laser.

(Configuration 9)
The mask blank according to any one of configurations 1 to 8, comprising a light-shielding film on the phase shift film.

(Configuration 10)
A phase shift mask comprising:
a light-transmissive substrate; and
a phase shift film on which a transfer pattern is formed, the phase shift film being provided on the light-transmissive substrate, in which
the phase shift film includes
a lower layer containing hafnium and oxygen and
an upper layer formed on the lower layer and containing silicon, oxygen, and nitrogen,
a total content of hafnium and oxygen in the lower layer is 95 atom % or more, and
a content of nitrogen in the upper layer is 15 atom % or more.

(Configuration 11)
The phase shift mask according to configuration 10, in which a content of oxygen in the upper layer is 50 atom % or less.

(Configuration 12)
The phase shift mask according to configuration 10 or 11, in which a content of oxygen in the lower layer is 50 atom % or more.

(Configuration 13)
The phase shift mask according to any one of configurations 10 to 12, in which a content of nitrogen in the upper layer is 60 atom % or less.

(Configuration 14)
The phase shift mask according to any one of configurations 10 to 13, in which
the phase shift film includes an intermediate layer formed between the lower layer and the upper layer, and
the intermediate layer consists of a material having a total content of silicon and oxygen of 90 atom % or more.

(Configuration 15)
The phase shift mask according to configuration 14, in which the intermediate layer consists of silicon and oxygen.

(Configuration 16)
The phase shift mask according to any one of configurations 10 to 15, in which the film thickness of the phase shift film is 60 nm or less.

(Configuration 17)
The phase shift mask according to any one of configurations 10 to 16, in which the phase shift film has a transmittance of 20% or more and a phase shift amount of 150 degrees or more and 210 degrees or less with respect to exposure light of an ArF excimer laser.

(Configuration 18)
The phase shift mask according to any one of configurations 10 to 17, comprising a light-shielding film on which a light shielding-pattern is formed, the light-shielding film being provided on the phase shift film.

(Configuration 19)
A method of manufacturing a semiconductor device, the method comprising transferring, by exposure, the transfer pattern onto a resist film on a semiconductor substrate using the phase shift mask according to any one of configurations 10 to 18.

A mask blank of the present disclosure having the above-mentioned configurations includes a light-transmissive substrate and a phase shift film formed on the light-transmissive substrate, in which the phase shift film includes a lower layer containing hafnium and oxygen and an upper layer formed on the lower layer and containing silicon, oxygen, and nitrogen, a total content of hafnium and oxygen in the lower layer is 95 atom % or more, and a content of nitrogen in the upper layer is 15 atom % or more. Therefore, the phase shift effect can be enhanced by increasing the transmittance to the exposure light, the film thickness of the phase shift film can be controlled to be small, a fine pattern can be formed, and the phase shift mask having favorable optical performance can be obtained. Furthermore, in manufacturing a semiconductor device using this phase shift mask, it is possible to accurately transfer a pattern to a resist film or the like on the semiconductor device.

Hereinafter, each embodiment of the present disclosure will be described. The inventors of the present application have extensively conducted studies on a phase shift film having a configuration that allows a transmittance to exposure light (in particular, exposure light of an ArF excimer laser, which may be hereinafter simply referred to as exposure light) to be increased to enhance a phase shift effect, a film thickness of the phase shift film to be controlled to be small, a fine pattern to be formed, and optical performance to be favorable. In the present specification, a transmittance means a value obtained by converting a transmittance on the basis of the transmittance of a light-transmissive substrate, where the transmittance of the light-transmissive substrate is defined to be 100%. The details of the light-transmissive substrate will be described later.

The phase shift film is expected to have both a function of transmitting exposure light with a predetermined transmittance and a function of generating a predetermined phase difference between exposure light passing through the phase shift film and exposure light passing through the air by the same distance as the thickness of the phase shift film. When an attempt is made to control the film thickness of the phase shift film to have a certain value or less, it is difficult to secure a desired phase difference. A phase shift film having a single-layer structure has a low degree of freedom in design, and it has not been easy to obtain a configuration that allows formation of a fine pattern with increased transmittance while securing a desired phase difference and has favorable optical performance.

Therefore, the inventors of the present application have studied that the phase shift film has at least a two-layer structure. In addition, the inventors have found that a desired phase difference can be secured and that a high transmittance can be obtained by adopting a configuration in which a phase shift film includes a lower layer and an upper layer from the light-transmissive substrate side, the lower layer containing hafnium and oxygen and the upper layer containing silicon, oxygen, and nitrogen. However, it has been found that, under this condition alone, even with the phase shift film having sufficiently high transmittance, the film thickness becomes large, and a fine pattern (for example, 20 nm or less) cannot be formed in some cases when adjustments are made so as to obtain a desired phase difference.

The present inventors have further conducted studies, and found that the composition of each of the lower layer and the upper layer of the phase shift film is important in order to obtain a desired phase difference and a desired high transmittance to enable formation of a fine pattern. Therefore, as a result of intensive studies on the composition of each of the lower layer and the upper layer of the phase shift film, it has been found that by setting the total content of hafnium and oxygen in the lower layer to 95 atom % or more and the content of nitrogen in the upper layer to 15 atom % or more, a desired phase difference and a desired high transmittance can be obtained to form a fine pattern in a state where the film thickness of the phase shift film is controlled to be small. The present disclosure has been made as a result of intensive studies as described above.

Hereinafter, a detailed configuration of the present disclosure described above will be described with reference to the drawings. In the drawings, the same components are denoted by the same reference numerals.

First Embodiment

FIG. 1 illustrates a schematic configuration of a mask blank according to a first embodiment. A mask blank 100 illustrated in FIG. 1 has a configuration in which a phase shift film 2, a light-shielding film 3, and a hard mask film 4 are layered in this order on one main surface of a light-transmissive substrate 1. The mask blank 100 may have a configuration in which the hard mask film 4 is not provided as necessary. Furthermore, the mask blank 100 may have a configuration in which a resist film is layered on the hard mask film 4 as necessary. Hereinafter, details of main components of the mask blank 100 will be described.

[Light-Transmissive Substrate]

The light-transmissive substrate 1 is made of a material having favorable transparency to exposure light used in an exposure process in lithography. As such a material, synthetic quartz glass, aluminosilicate glass, soda lime glass, low thermal expansion glass ($SiO_2$—$TiO_2$ glass or the like), and other various glass substrates can be used. In particular, a substrate using synthetic quartz glass has high transparency to ArF excimer laser light (wavelength: about 193 nm), and thus can be suitably used as the light-transmissive substrate 1 of the mask blank 100.

Note that the exposure process in lithography as used herein is an exposure process in lithography using a phase shift mask prepared using the mask blank 100, and the exposure light refers to ArF excimer laser light (wavelength: 193 nm) unless otherwise specified.

The refractive index of the material forming the light-transmissive substrate 1 with respect to the exposure light is preferably 1.5 or more and 1.6 or less, more preferably 1.52 or more and 1.59 or less, and still more preferably 1.54 or more and 1.58 or less.

[Phase Shift Film]

The phase shift film 2 preferably has a function of transmitting exposure light with a transmittance of 20% or more, more preferably 30% or more, and still more preferably 40% or more. This is for generating a sufficient phase shift effect between the exposure light transmitted through the phase shift film 2 and the exposure light transmitted through the air. The upper limit value of the transmittance of the phase shift film 2 with respect to the exposure light can be set as appropriate, and is not particularly limited, but is preferably 60% or less, and more preferably 50% or less. This is for controlling the film thickness of the phase shift film 2 in an appropriate range in which optical performance can be secured. In addition, by setting the transmittance of the phase shift film 2 with respect to the exposure light to 60% or less, it is possible to suppress exposure of the photosensitive material (for example, a resist film) on a transferred object to unnecessary light in the above exposure process.

In order to obtain an appropriate phase shift effect, the phase shift film 2 is preferably adjusted so as to have a function of generating a phase difference (phase shift amount) of 150 degrees or more and 210 degrees or less between exposure light that has passed through the phase shift film 2 and exposure light that has passed through the air by the same distance as the thickness of the phase shift film 2. The phase difference with respect to the phase shift film 2 is more preferably 155 degrees or more, and still more preferably 160 degrees or more. On the other hand, the phase difference with respect to the phase shift film 2 is more preferably 195 degrees or less, and still more preferably 190 degrees or less.

The phase shift film 2 in the present embodiment has a structure in which a lower layer 21 and an upper layer 22 are layered from the light-transmissive substrate 1 side. In the present embodiment, the lower layer 21 is formed in contact with the light-transmissive substrate 1, but the lower layer 21 may be formed above the light-transmissive substrate 1 with another film interposed therebetween. In the present embodiment, the upper layer 22 is formed in contact with the lower layer 21.

The film thickness of the phase shift film 2 is preferably 60 nm or less and more preferably 59 nm or less in order to form a fine pattern (for example, 20 nm or less) and secure optical performance. In addition, the film thickness of the phase shift film 2 is preferably 45 nm or more and more preferably 50 nm or more in order to easily secure a function of generating a desired phase difference. It is assumed that the thickness of each layer (lower layer 21, upper layer 22, intermediate layer 23) of the phase shift film 2 described later satisfies the film thickness of the phase shift film 2 described above.

The lower layer 21 preferably contains hafnium and oxygen, and more preferably consists of hafnium and oxygen. Here, the phrase "consists of hafnium and oxygen" refers to a material containing, in addition to hafnium and oxygen, only elements that may be slightly contained in the lower layer 21 as impurities like noble gases such as helium (He), neon (Ne), argon (Ar), krypton (Kr), and xenon (Xe), hydrogen (H), carbon (C), and the like when the lower layer 21 is formed by a sputtering method. The ratio of bonds of hafnium and oxygen in the lower layer 21 can be significantly increased by minimizing the presence of other elements that bond to hafnium in the lower layer 21.

Therefore, the total content of hafnium and oxygen in the lower layer 21 is more preferably 95 atom % or more, and still more preferably 98 atom % or more. In addition, the content of oxygen in the lower layer 21 is preferably 50 atom % or more, more preferably 55 atom % or more, and still more preferably 60 atom % or more. In addition, the total content is preferably 3 atom % or less, and more preferably 2 atom % or less also in the above-mentioned elements (noble gases, hydrogen, carbon, and the like) that may be slightly contained in the lower layer 21 as impurities.

In addition, the lower layer 21 has a first interface region in contact with a film (for example, the upper layer 22 or the intermediate layer 23) provided on and in contact with the lower layer 21 and a second interface region in contact with the light-transmissive substrate 1. The lower layer 21 preferably does not contain silicon except for the first interface region or second interface region. As a result, the lower layer 21 can have high chemical resistance and cleaning resistance.

The refractive index n of the lower layer 21 with respect to exposure light is preferably 3.1 or less, and more preferably 3.0 or less. The refractive index n of the lower layer 21 is preferably 2.5 or more, and more preferably 2.6 or more. On the other hand, the lower layer 21 preferably has an extinction coefficient k for exposure light of 0.4 or less, and more preferably 0.3 or less. This is for increasing the transmittance of the phase shift film 2 with respect to exposure light. The extinction coefficient k of the lower layer 21 is preferably 0.15 or more, and more preferably 0.2 or more.

The thickness of the lower layer 21 is preferably 5 nm or more, more preferably 10 nm or more, and still more preferably 20 nm or more from the viewpoint of chemical resistance and cleaning resistance. Interdiffusion may occur at an interface between the lower layer 21 and the upper layer 22 containing silicon and oxygen or an interface between the lower layer 21 and the light-transmissive substrate 1, and thus the lower layer 21 may contain hafnium, silicon, and oxygen. Thin films containing hafnium, silicon, and oxygen tend to have low chemical resistance and cleaning resistance. However, by setting the thickness of the lower layer 21 within the above range, the occurrence of interdiffusion in the entire lower layer 21 can be restrained, and also deterioration in chemical resistance and cleaning resistance of the lower layer 21 can be restrained.

In addition, the thickness of the lower layer 21 is preferably 46 nm or less, and more preferably 45 nm or less, from the viewpoint of optical characteristics.

It is preferable that an X-ray diffraction profile in a range of a diffraction angle 2θ of 25 degrees to 35 degrees has a maximum value of diffraction intensity in a range of a diffraction angle 2θ of 28 degrees to 29 degrees when the X-ray diffraction profile is obtained by performing analysis by Out-of-Plane measurement of an X-ray diffraction method on the lower layer 21. That is, when Out-of-Plane measurement of the X-ray diffraction method is performed, the X-ray diffraction profile in the range of the diffraction angle 2θ of 25 degrees to 35 degrees in the lower layer 21 has the maximum diffraction peak within the range of the diffraction angle 2θ of 28 degrees to 29 degrees while the X-ray diffraction profile has no diffraction peak in other ranges or while the diffraction peak in other ranges is sufficiently distinguishably low from the maximum diffraction peak within the range of 28 degrees to 29 degrees.

When a maximum value of diffraction intensity at a diffraction angle 2θ of 28 degrees to 29 degrees in an X-ray diffraction profile is denoted by I_Lmax, and a maximum value of diffraction intensity at a diffraction angle 2θ of 30 degrees to 32 degrees is denoted by I_Hmax, I_Lmax/I_Hmax is preferably 1.5 or more, more preferably 1.7 or more, and still more preferably 1.9 or more.

The lower layer 21 having such an X-ray diffraction profile is preferable in that detection of a pseudo defect can be suppressed. The pseudo defect as used herein refers to an allowable unevenness on the thin film surface that does not affect pattern transfer, and is erroneously determined as a defect when inspected by a defect inspection apparatus. In the defect inspection, when a large number of such pseudo defects are detected, a fatal defect that affects pattern transfer is mixed with the large number of pseudo defects, and thus there is a possibility that a fatal defect, which should not be failed to be detected, cannot be found.

In addition, from the viewpoint of further reducing or restraining the detection of the pseudo defect, it is preferable that the lower layer 21 has crystallinity, and that the degree of orientation of m[11-1] is the largest among the orientations of m[11-1], o[111], and m[111] in the lower layer 21. The lower layer 21 preferably has crystallinity, and it is preferable that the orientation of o[111] has the smallest degree of orientation among the orientations of m[11-1], o[111], and m[111] the lower layer 21.

Here, m[11-1] and m[111] are a [11-1] plane and a [111] plane in a primitive monoclinic lattice, respectively, and have diffraction angles 2θ of 28.589 degrees and 31.811 degrees, respectively. In addition, o[111] is a [111] plane in a primitive orthorhombic lattice, and has a diffraction angle 2θ of 30.056 degrees. Note that m[11-1] is also described as $$m[1\overline{1}1] \qquad \text{[Mathematical Formula 1]}$$

but described herein as m[11-1].

The upper layer 22 preferably contains silicon, oxygen, and nitrogen, and more preferably consists of silicon, oxygen, and nitrogen. Here, the phrase "consists of silicon, oxygen, and nitrogen" refers to a material containing, in addition to silicon, oxygen, and nitrogen, only elements that may be slightly contained in the upper layer 22 as impurities such as above-mentioned noble gases, hydrogen (H), carbon (C), and the like when the upper layer 22 is formed by a sputtering method. The total content of silicon, oxygen, and nitrogen in the upper layer 22 is preferably 95 atom % or more, and still more preferably 98 atom % or more. In addition, as described for the lower layer, the total content of elements that may be very slightly contained as the impurities in the upper layer 22 is preferably 3 atom % or less, and more preferably 2 atom % or less.

The total content of nitrogen in the upper layer 22 is preferably 15 atom % or more, and still more preferably 18 atom % or more. As a result, the film thickness of the entire phase shift film can be further reduced. On the other hand, the content of nitrogen in the upper layer 22 is preferably 60 atom % or less, and more preferably 50 atom % or less. As a result, the transmittance of the entire phase shift film can be increased.

The content of oxygen in the upper layer 22 is preferably 20 atom % or more, and more preferably 25 atom % or more. As a result, the transmittance of the entire phase shift film can be increased. On the other hand, the content of oxygen in the upper layer 22 is preferably 50 atom % or less, and more preferably 45 atom % or less. This makes it possible to reduce the film thickness of the entire phase shift film while securing desired optical characteristics.

The refractive index n of the upper layer 22 with respect to exposure light is preferably 2.3 or less, and more preferably 2.2 or less. The refractive index n of the upper layer 22 is preferably 1.8 or more, and more preferably 1.9 or more. On the other hand, the upper layer 22 preferably has an extinction coefficient k for exposure light smaller than that of the lower layer 21, specifically has an extinction coefficient k of preferably less than 0.15, and more preferably 0.13 or less. This is for increasing the transmittance of the phase shift film 2 with respect to exposure light. In addition, the extinction coefficient k of the upper layer 22 for exposure light is preferably 0.01 or more, more preferably 0.02 or more, and still more preferably 0.04 or more. This makes it possible to reduce the film thickness of the entire phase shift film while securing desired optical characteristics.

The thickness of the upper layer 22 is preferably 5 nm or more, more preferably 7 nm or more, and still more preferably 10 nm or more. In order to control the film thickness of the phase shift film 2 to be small, the thickness of the upper layer 22 is preferably 25 nm or less, and more preferably 20 nm or less.

More preferably, the phase shift film 2 has a configuration in which the lower layer 21 is thicker than the upper layer 22. At the time of patterning the phase shift film 2, so-called over-etching, that is, continuing dry etching even after etching with respect to the phase shift film 2 reaches the surface of the light-transmissive substrate 1, is performed for the reason of enhancing the perpendicularity of the pattern sidewall to be formed, or the like. In the over-etching, the pattern sidewall formed on the phase shift film 2 is mainly etched in a region close to the light-transmissive substrate 1. When the thickness of the lower layer 21 is large, the ratio of the lower layer 21 is relatively high in the pattern sidewall of the phase shift film 2. In that case, it is easy to control the perpendicularity of the pattern sidewall of the phase shift film 2 by over-etching.

The refractive index n and the extinction coefficient k of a thin film including the phase shift film 2 are not determined only by the composition of the thin film. The film density, crystal state, and the like of the thin film are also factors that affect the refractive index n and the extinction coefficient k. For this reason, various conditions in forming a thin film by reactive sputtering are adjusted, and the thin film is formed so as to have a desired refractive index n and an extinction coefficient k. How to make the phase shift film 2 to have the above-described range of the refractive index n and the extinction coefficient k is not limited to adjusting the ratio of the mixed gas of the noble gas and the reactive gas (oxygen gas, nitrogen gas, etc.) at the time of film formation by reactive sputtering. There are a variety of conditions to be adjusted, such as the pressure in the film forming chamber when a film is formed by reactive sputtering, the power applied to the sputtering target, and positional relationships such as the distance between the target and the light-transmissive substrate 1. These film forming conditions are unique to the film forming apparatus, and are adjusted as appropriate so that a thin film to be formed has a desired refractive index n and an extinction coefficient k.

[Light-Shielding Film]

The mask blank 100 includes the light-shielding film 3 on the phase shift film 2. In the phase shift mask, an outer peripheral region surrounding a region where a transfer pattern is formed (transfer pattern formation region) may be provided to secure an optical density (hereinafter referred to as OD) of a predetermined value or more so that the resist film is not affected by exposure light transmitted through the outer peripheral region when exposure and transfer are performed to the resist film on the semiconductor wafer using an exposure apparatus. The OD of the outer peripheral region of the phase shift mask is preferably 2.8 or more, and more preferably 3.0 or more. As described above, the phase shift film 2 has a function of transmitting exposure light with a predetermined transmittance, and thus it may be difficult to secure an optical density of a predetermined value only with the phase shift film 2. Therefore, the light-shielding film 3 may be layered on the phase shift film 2 at the stage of manufacturing the mask blank 100 in order to secure optical density which otherwise would be lack. With such a configuration of the mask blank 100, it is possible to manufacture the phase shift mask 200 in which the optical density of a predetermined value is secured in the outer peripheral region by removing the light-shielding film 3 in the region (basically, the transfer pattern formation region) where the phase shift effect is used in the course of manufacturing the phase shift mask 200 (see FIG. 2).

The light-shielding film 3 can have either a single-layer structure or a stack of two or more layers. In addition, each layer of the light-shielding film 3 having a single-layer structure and the light-shielding film 3 having a stack of two or more layers may have substantially the same composition in the thickness direction of the film or the layer, or may have a composition graded in the thickness direction of the layer.

The mask blank 100 in the embodiment illustrated in FIG. 1 has a configuration in which the light-shielding film 3 is layered on the phase shift film 2 without interposing another film. The light-shielding film 3 in this configuration is preferably made of a material having sufficient etching selectivity with respect to an etching gas used for forming a pattern on the phase shift film 2. The light-shielding film 3 in this case is preferably formed of a material containing chromium. Examples of the material containing chromium that forms the light-shielding film 3 include, in addition to chromium metal, a material containing chromium and one or more elements selected from oxygen, nitrogen, carbon, boron, and fluorine.

A chromium-based material is etched with a mixed gas of a chlorine-based gas and an oxygen gas, but chromium metal has an etching rate not that high for this etching gas. Considering that the etching rate of the etching gas made of the mixed gas of the chlorine-based gas and the oxygen gas is increased, the material for forming the light-shielding film 3 is preferably a material containing chromium and one or more elements selected from oxygen, nitrogen, carbon, boron, and fluorine. In addition, one or more elements of molybdenum, indium, and tin may be contained in the material containing chromium that forms the light-shielding film 3. Containing one or more elements of molybdenum, indium, and tin makes it possible to further increase the etching rate with respect to the mixed gas of the chlorine-based gas and the oxygen gas.

Furthermore, when a hard mask film 4 to be described later is formed of a material containing chromium on the light-shielding film 3, the light-shielding film 3 may be formed of a material containing silicon. In particular, a material containing a transition metal and silicon has high light shielding performance thus can reduce the thickness of the light-shielding film 3. In this case, an etching mask film may be formed between the phase shift film 2 and the light-shielding film 3, the etching mask film being made of a material having sufficient etching resistance to an etching gas used for etching the phase shift film 2 and the light-shielding film 3. Examples of the transition metal contained in the light-shielding film 3 include any one metal of molybdenum (Mo), tantalum (Ta), tungsten (W), titanium (Ti), chromium (Cr), nickel (Ni), vanadium (V), zirconium (Zr), ruthenium (Ru), rhodium (Rh), zinc (Zn), niobium (Nb), palladium (Pd), and the like, or an alloy of these metals. Examples of the metal element other than the transition metal element contained in the light-shielding film 3 include aluminum (Al), indium (In), tin (Sn), gallium (Ga), and the like.

On the other hand, the light-shielding film 3 may have a structure in which a layer containing chromium and a layer containing a transition metal and silicon are layered in this order on the phase shift film 2. The specific matters of the materials of the layer containing chromium and the layer containing transition metal and silicon in this case are the same as those in the case of the light-shielding film 3 described above.

[Hard Mask Film]

The hard mask film 4 is provided on and in contact with the surface of the light-shielding film 3. The hard mask film 4 is a film formed of a material having etching resistance to an etching gas used for etching the light-shielding film 3. It is sufficient that the hard mask film 4 has a film thickness enough to function as an etching mask until dry etching for forming a pattern on the light-shielding film 3 is completed, and basically, the hard mask film 4 is not limited in optical characteristics. Therefore, the thickness of the hard mask film 4 can be made significantly thinner than the thickness of the light-shielding film 3.

In a case where the light-shielding film 3 is formed of a material containing chromium, the hard mask film 4 is preferably formed of a material containing silicon. Note that, since the hard mask film 4 in this case tends to have low adhesion to a resist film of an organic material, it is preferable to perform a hexamethyldisilazane (HMDS) treatment on the surface of the hard mask film 4 to improve the adhesion of the surface. Note that the hard mask film 4 in this case is more preferably formed of $SiO_2$, SiN, SiON, or the like.

In addition to the above, a material containing tantalum is also applicable as the material of the hard mask film 4 in a case where the light-shielding film 3 is formed of a material containing chromium. Examples of the material containing tantalum in this case include tantalum metal and a material or the like containing tantalum and one or more elements selected from nitrogen, oxygen, boron, and carbon. Examples of the material containing tantalum include Ta, TaN, TaO, TaON, TaBN, TaBO, TaBON, TaCN, TaCO, TaCON, TaBCN, TaBOCN, and the like. In addition, in a case where the light-shielding film 3 is formed of a material containing silicon, the hard mask film 4 is preferably formed of the material containing chromium described above.

[Resist Film]

In the mask blank 100, a resist film of an organic material is preferably formed with a film thickness of 100 nm or less in contact with the surface of the hard mask film 4. In the case of a pattern corresponding to the DRAM hp 32 nm generation, a sub-resolution assist feature (SRAF) having a line width of 40 nm may be provided in a transfer pattern (phase shift pattern) to be formed on the hard mask film 4. However, even in this case, by providing the hard mask film 4 as described above, the film thickness of the resist film can be reduced, whereby the cross-sectional aspect ratio of the resist pattern formed by the resist film can be reduced to 1:2.5. Therefore, it is possible to restrain collapse and detachment of the resist pattern during development, rinsing, or the like of the resist film. The resist film more preferably has a film thickness of 80 nm or less. The resist film is preferably a resist film for electron beam drawing exposure, and more preferably a chemically amplified resist film.

Second Embodiment

Figure 2:
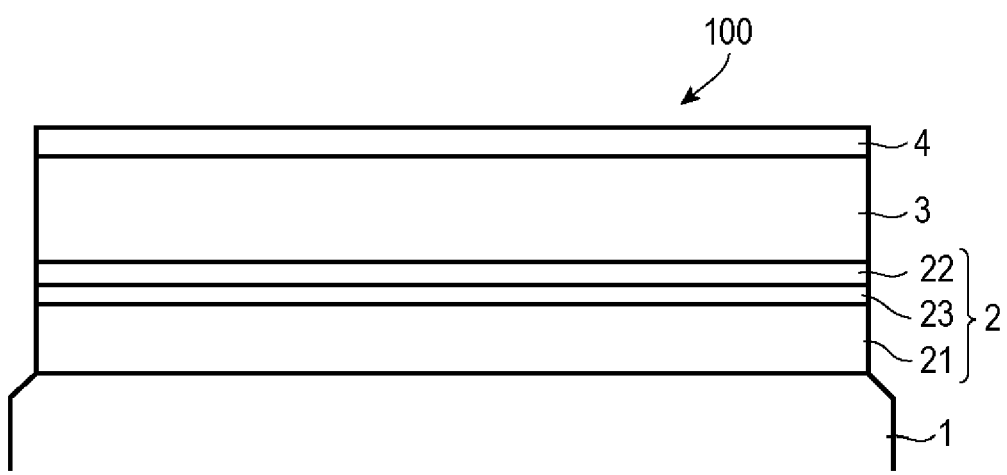
FIG. 2 is a schematic cross-sectional view of a mask blank according to a second embodiment.

FIG. 2 is a cross-sectional view illustrating a configuration of the mask blank 100 according to a second embodiment of the present disclosure. The mask blank 100 illustrated in FIG. 2 is different from the mask blank 100 illustrated in FIG. 1 in that the phase shift film 2 has a three-layer structure including the lower layer 21, the upper layer 22, and additionally the intermediate layer 23 therebetween. In the present embodiment, the intermediate layer 23 is formed in contact with each of the lower layer 21 and the upper layer 22. Hereinafter, description of points common to the mask blank 100 of the first embodiment will be omitted as appropriate. Note that the thickness of each layer of the phase shift film 2 illustrated in FIGS. 1 and 2 is illustrative as understood from the above description, and the thickness of each layer is not limited to the illustrated one.

The intermediate layer 23 preferably contains silicon and oxygen, and more preferably consists of silicon and oxygen. Here, the phrase "consists of silicon and oxygen" refers to a material containing, in addition to silicon and oxygen, only elements that may be slightly contained in the intermediate layer 23 as impurities such as above-mentioned noble gases, hydrogen (H), carbon (C), and the like when the intermediate layer 23 is formed by a sputtering method. In a case where the intermediate layer 23 contains an element other than silicon and oxygen, the total content of silicon and oxygen is preferably 90 atom % or more, more preferably 95 atom % or more, and still more preferably 98 atom % or more. By providing such an intermediate layer 23, adhesion to the lower layer 21 and the upper layer 22 can be improved. In addition, as described for the lower layer, the total content of elements that may be very slightly contained as the impurities in the intermediate layer 23 is preferably 3 atom % or less, and more preferably 2 atom % or less.

The thickness of the intermediate layer 23 is preferably larger than 1 nm, and more preferably 2 nm or more from the viewpoint of securing the function of improving adhesion. In addition, the thickness of the intermediate layer 23 is preferably 10 nm or less, more preferably 8 nm or less, and still more preferably 5 nm or less in order to control the film thickness of the phase shift film 2 to be small.

In the phase shift film 2 including the intermediate layer 23, the thickness of the lower layer 21 is preferably 5 nm or more, more preferably 10 nm or more, and still more preferably 20 nm or more. On the other hand, the thickness of the lower layer 21 is preferably 46 nm or less, and more preferably 45 nm or less.

In the phase shift film 2 including the intermediate layer 23, the thickness of the upper layer 22 is preferably 5 nm or more, more preferably 7 nm or more, and still more preferably 10 nm or more. On the other hand, the thickness of the upper layer 22 is preferably 25 nm or less, and more preferably 20 nm or less.

Although the phase shift film 2 having a two-layer structure has been described in the first embodiment and the phase shift film 2 having a three-layer structure has been described in the second embodiment, the contents of the present disclosure are not limited thereto. As long as desired transmittance, phase difference, and film thickness are satisfied, four or more layers in which a film having a configuration similar to that of the above-described lower layer, upper layer, or intermediate layer, or other film is further layered may be used.

The phase shift film 2 in the mask blank 100 of the first and second embodiments can be patterned by two-stage dry etching processing using a chlorine-based gas and a fluorine-based gas. The lower layer 21 is preferably patterned by dry etching using a chlorine-based gas, and the upper layer 22 and the intermediate layer 23 are preferably patterned by dry etching using a fluorine-based gas. The etching selectivity is high between the lower layer 21 and the upper layer 22 (and the intermediate layer 23). Although not particularly limited, by performing etching processing divided into multiple stages to the phase shift film 2 having the above characteristics, it is possible to restrain the influence of side etching and obtain a favorable pattern cross-sectional shape.

When the total content of hafnium and oxygen in the lower layer 21 is 95 atom % or more and the content of nitrogen in the upper layer 22 is 15 atom % or more, the etching resistance of the upper layer 22 to an etching gas (chlorine-based gas) used for etching of the lower layer 21 can be sufficiently secured. As a result, it is possible to restrain the pattern sidewall of the upper layer 22 from being etched during etching of the lower layer 21. Therefore, a favorable pattern cross-sectional shape can be obtained.

When a pattern is formed on a thin film by dry etching, additional etching (so-called over-etching) for enhancing the perpendicularity of the sidewall of the pattern formed on the thin film can be performed. In addition, over-etching is often set on the basis of a time when etching reaches the lower surface of the thin film, a so-called just etching time. As described above, by applying the etching processing divided into multiple stages to the patterning of the phase shift film 2, the reference time of the over-etching time can be set as the just etching time of the lower layer 21 of the phase shift film 2. As a result, the over-etching time can be shortened, and favorable etching depth uniformity can be obtained. Here, the chlorine-based gas is preferably a chlorine-based gas containing boron, more preferably a $BCl_3$ gas, and still more preferably a mixed gas of a $BCl_3$ gas and a $Cl_2$ gas.

[Manufacturing Procedure of Mask Blank]

The mask blank 100 having the above configuration is manufactured by the following procedure. First, the light-transmissive substrate 1 is prepared. The light-transmissive substrate 1 has an end surface and a main surface polished to have predetermined surface roughness (for example, in an inner region of a square having a side of 1 μm, a root mean square roughness Rq is 0.2 nm or less), and then subjected to predetermined cleaning treatment and drying treatment.

Next, the lower layer 21 and the upper layer 22 are formed in this order to form the phase shift film 2 on the light-transmissive substrate 1 by a sputtering method. In the case where the phase shift film 2 includes the intermediate layer 23, the lower layer 21, the intermediate layer 23, and the upper layer 22 are formed in this order. The lower layer 21 and the upper layer 22 (and the intermediate layer 23) in the phase shift film 2 are formed by sputtering, and it is possible to apply any sputtering such as DC sputtering, RF sputtering, or ion beam sputtering. In consideration of the film formation rate, it is preferable to apply DC sputtering. In the case of using a target having low conductivity, it is preferable to apply RF sputtering or ion beam sputtering, and in consideration of the film formation rate, it is more preferable to apply RF sputtering.

As the lower layer 21 of the phase shift film 2, any of a sputtering target containing hafnium and a sputtering target containing hafnium and oxygen can be applied.

In addition, as the upper layer 22 (and the intermediate layer 23) of the phase shift film 2, it is possible to apply any of a sputtering target containing silicon and a sputtering target containing silicon and oxygen.

When an annealing treatment (heat treatment) is performed after the lower layer 21 of the phase shift film 2 is formed and before the upper layer 22 is formed, the film stress of the lower layer 21 is reduced, which is preferable in that film peeling defects due to a stress difference between the lower layer 21 and the upper layer 22 can be reduced to improve the quality of the phase shift film 2.

Here, in the case of the phase shift film 2 having a three-layer structure including the intermediate layer 23, adhesion to the lower layer 21 and the upper layer 22 can be improved. Therefore, forming the intermediate layer 23 and the upper layer 22 without performing the annealing treatment for reducing the film stress after the formation of the lower layer 21 is also preferable from the viewpoint that the phase shift film 2 can be obtained with less defects and good quality.

After the phase shift film 2 is formed, an annealing treatment at a predetermined heating temperature is performed as appropriate. Next, the light-shielding film 3 is formed on the phase shift film 2 by a sputtering method. Then, the hard mask film 4 is formed on the light-shielding film 3 by a sputtering method. In film formation by the sputtering method, a sputtering target and a sputtering gas containing materials constituting the respective films at a predetermined composition ratio are used, and a mixed gas of the noble gas and a reactive gas is further used as the sputtering gas as necessary. Thereafter, in a case where the mask blank 100 includes a resist film, a hexamethyldisilazane (HMDS) treatment is performed on the surface of the hard mask film 4 as necessary. Then, a resist film is formed on the surface of the hard mask film 4 subjected to the HMDS treatment by a coating method such as a spin coating method to complete the mask blank 100.

As described above, according to the mask blank 100 of the first and second embodiments, the phase shift effect can be enhanced by increasing the transmittance with respect to the exposure light (in particular, exposure light of an ArF excimer laser), the film thickness of the phase shift film can be controlled to be small, a fine pattern can be formed, and the phase shift mask 200 having favorable optical performance can be manufactured.

<Phase Shift Mask and Method of Manufacturing the Same>

FIGS. 3A to 3G illustrate the phase shift mask 200, according to the embodiments of the present disclosure, manufactured from the mask blank 100 of the above embodiments, and the manufacturing process thereof. As illustrated in FIG. 3G, the phase shift mask 200 is characterized in that a phase shift pattern 2a that is a transfer pattern is formed on the phase shift film 2 of the mask blank 100, and a light-shielding pattern 3b having a pattern including a light shielding band is formed on the light-shielding film 3. The phase shift mask 200 has technical features similar to those of the mask blank 100. Items related to the light-transmissive substrate 1, the lower layer 21 and the upper layer 22 (and the intermediate layer 23) of the phase shift film 2, and the light-shielding film 3 in the phase shift mask 200 are the same as those of the mask blank 100. The hard mask film 4 is removed in the course of production of the phase shift mask 200.

The method of manufacturing the phase shift mask 200 according to the embodiments of the present disclosure uses the mask blank 100 described above, and includes a process of forming a transfer pattern on the light-shielding film 3 by dry etching, a process of forming a transfer pattern on the phase shift film 2 by dry etching using the light-shielding film 3 having a transfer pattern as a mask, and a process of forming a light-shielding pattern 3b on the light-shielding film 3 by dry etching using a resist film (resist pattern 6b) having a light-shielding pattern as a mask. Hereinafter, a method of manufacturing the phase shift mask 200 of the present disclosure will be described according to the manufacturing process illustrated in FIGS. 3A to 3G. Note that description will be provided here on a method of manufacturing the phase shift mask 200 using the mask blank 100 in which the hard mask film 4 is layered on the light-shielding film 3. In addition, description will be provided on a case where a material containing chromium is applied to the light-shielding film 3 and a material containing silicon is applied to the hard mask film 4.

First, a resist film is formed by a spin coating method in contact with the hard mask film 4 in the mask blank 100. Next, a first pattern that is a transfer pattern (phase shift pattern) to be formed on the phase shift film 2 is drawn by exposure of an electron beam on the resist film, and predetermined treatment such as development treatment is further performed to form a first resist pattern 5a corresponding to the phase shift pattern (see FIG. 3A). Subsequently, dry etching using a fluorine-based gas is performed using the first resist pattern 5a as a mask to form a first pattern (hard mask pattern 4a) on the hard mask film 4 (see FIG. 3B).

Next, after the resist pattern 5a is removed, dry etching using a mixed gas of a chlorine-based gas and an oxygen gas is performed using the hard mask pattern 4a as a mask to form a light-shielding pattern 3a corresponding to the first pattern on the light-shielding film 3 (see FIG. 3C). Subsequently, dry etching using a fluorine-based gas and dry etching using a chlorine-based gas are alternately performed using the light-shielding pattern 3a as a mask, and a first pattern (phase shift pattern 2a) is formed on the phase shift film 2 and the hard mask pattern 4a is removed (see FIG. 3D). More specifically, dry etching using a fluorine-based gas is performed on the upper layer 22 (and the intermediate layer 23), and dry etching using a chlorine-based gas is performed on the lower layer 21.

Next, a resist film is formed on the mask blank 100 by a spin coating method. Next, a second pattern corresponding to a pattern (light-shielding pattern) to be formed on the light-shielding film 3 is drawn by exposure of an electron beam on the resist film, and predetermined treatment such as development treatment is further performed to form a second resist pattern 6b corresponding to the light-shielding pattern (see FIG. 3E). Subsequently, dry etching using a mixed gas of a chlorine-based gas and an oxygen gas is performed using the second resist pattern 6b as a mask to form a second pattern (light-shielding pattern 3b) on the light-shielding film 3 (see FIG. 3F). Furthermore, the second resist pattern 6b is removed, and the phase shift mask 200 is obtained through predetermined treatment such as cleaning (see FIG. 3G).

The chlorine-based gas used in the dry etching described above is not particularly limited as long as Cl is contained. Examples thereof include $Cl_2$, $SiCl_2$, $CHCl_3$, $CH_2Cl_2$, $CCl_4$, $BCl_3$, and the like. The chlorine-based gas used in the dry etching for the lower layer 21 described above preferably contains boron, and more preferably contains $BCl_3$. In particular, a mixed gas of a $BCl_3$ gas and a $Cl_2$ gas is preferable because an etching rate with respect to hafnium is relatively high.

The phase shift mask 200 manufactured by the method of manufacturing illustrated in FIGS. 3A to 3G is a phase shift mask provided with the phase shift film 2 having a transfer pattern (phase shift pattern 2a) on the light-transmissive substrate 1.

By manufacturing the phase shift mask 200 as described above, the phase shift effect can be enhanced by increasing the transmittance to the exposure light (in particular, exposure light of an ArF excimer laser), the film thickness of the phase shift film can be controlled to be small, a fine pattern can be formed, and the phase shift mask 200 having favorable optical performance can be obtained.

Then, an exposure margin can be secured when the phase shift mask 200 including the phase shift film is set in the exposure apparatus to transfer the transfer pattern by exposure to a transfer target (such as a resist film on a semiconductor substrate).

Furthermore, the method of manufacturing a semiconductor device according to the present disclosure includes a process of transferring a transfer pattern to a resist film on a semiconductor substrate by exposure using the phase shift mask 200 described above.

Since the phase shift mask 200 and the mask blank 100 of the present disclosure have the above-described effects, when the phase shift mask 200 is set on a mask stage of an exposure apparatus using an ArF excimer laser as exposure light and a transfer pattern is transferred to a resist film on a semiconductor device by exposure, the transfer pattern can be transferred to the resist film on the semiconductor device with high CD in-plane uniformity (CD uniformity). Therefore, when a lower-positioned layer film is dry-etched using the pattern of the resist film as a mask to form a circuit pattern, it is possible to form a highly accurate circuit pattern without a wiring short circuit or disconnection due to a decrease in CD in-plane uniformity.

EXAMPLES

Hereinafter, description will be provided on Examples 1 to 3 and Comparative Example 1 for more specifically describing embodiments of the present disclosure.

Example 1

[Manufacture of Mask Blank]

Referring to FIG. 1, the light-transmissive substrate 1 configured by synthetic quartz glass having a main surface dimension of about 152 mm×about 152 mm and a thickness of about 6.35 mm was prepared. The light-transmissive substrate 1 had an end surface and the main surface polished to have predetermined surface roughness (Rq: 0.2 nm or less), and then subjected to predetermined cleaning treatment and drying treatment. When each optical characteristic of the light-transmissive substrate 1 was measured using a spectroscopic ellipsometer (M-2000D manufactured by J.A. Woollam Company), the refractive index and the extinction coefficient of light having a wavelength of 193 nm were 1.556 and 0.000, respectively.

Next, the light-transmissive substrate 1 was placed in a single wafer type RF sputtering device, and the lower layer 21 configured by hafnium and oxygen was formed on the light-transmissive substrate 1 by reactive sputtering (RF sputtering) in a mixed gas atmosphere of krypton (Kr) and oxygen (02) using a HfO$_2$ target. A film of the lower layer of Example 1 was formed on another light-transmissive substrate, and composition analysis was performed. As a result, hafnium (Hf):oxygen (O)=37 atom %:63 atom %, and the total content of hafnium and oxygen in the lower layer 21 was 100 atom %, which was 95 atom % or more. In addition, the content of oxygen in the lower layer 21 was 63 atom %, which was 50 atom % or more.

In addition, the lower layer of Example 1 was formed on another light-transmissive substrate, and analyzed by Out-of-Plane measurement (8-28 measurement) of an X-ray diffraction method. As a result, when the diffraction angle 28 was in the range of 25 degrees to 35 degrees, the diffraction intensity had a maximum value in the range of 28 degrees to 29 degrees.

Further, when a maximum value of diffraction intensity at a diffraction angle 28 between 28 degrees and 29 degrees is I_Lmax, and a maximum value of diffraction intensity at a diffraction angle 28 between 30 degrees and 32 degrees is I_Hmax, I_Lmax/I_Hmax was 1.5 or more.

As a result of examining the degree of orientation at each peak of the diffracted X-ray intensity, among the respective orientations of m[11-1], o[111], and m[111], the degree of orientation of m[11-1] was the largest, and the degree of orientation of o[111] was the smallest.

Furthermore, in order to confirm that the pseudo defects of the phase shift film 2 in Example 1 were reduced, the surface state of the phase shift film 2 of the mask blank obtained by performing the same procedure as described above using another light-transmissive substrate was measured by a non-contact surface shape measuring instrument to perform power spectral density analysis. In the power spectral density analysis, the surface state of the phase shift film 2 in Example 1 was measured with an atomic force microscope (measurement area: 10 μm×10 μm, number of pixels: 256×256).

As a result of the power spectral density analysis, in the low spatial frequency region of the spatial frequency of 0.1 μm$^{-1}$ or more and 1.0 μm$^{-1}$ or less, the maximum value of the power spectral density was $1.2 \times 10^6$ nm$^4$ or less. As the value of the power spectral density in the low spatial frequency region is smaller, pseudo defects can be reduced more. That is, in Example 1, it was clear that sufficient reduction of the pseudo defects was achieved.

After the lower layer 21 of the phase shift film 2 was formed, an annealing treatment (heat treatment) was performed before the upper layer 22 was formed. Then, the upper layer 22 configured by silicon, oxygen, and nitrogen was formed on the lower layer 21 on the light-transmissive substrate 1 by reactive sputtering (RF sputtering) in a mixed gas atmosphere of krypton (Kr), oxygen (02), and nitrogen (N$_2$) using a Si target to form the phase shift film 2 including the lower layer 21 and the upper layer 22. A film of the upper layer was formed on another light-transmissive substrate under the same conditions, and composition analysis was performed. As a result, Si:O:N was 37%:45%:18%, the content of nitrogen was 15 atom % or more and 60 atom % or less, and the content of oxygen was 50 atom % or less.

The thickness of the lower layer 21 was 42 nm, the thickness of the upper layer 22 was 18 nm, and the thickness of the phase shift film 2 was 60 nm.

Next, the light-transmissive substrate 1 on which the phase shift film 2 was formed was subjected to a heat treatment for reducing the film stress of the phase shift film 2. Using a phase shift amount measurement device (MPM193 manufactured by Lasertec Corporation), the transmittance and the phase difference of the phase shift film 2 after the heat treatment with respect to light having a wavelength of 193 nm were measured. As a result, the transmittance was 40.9%, which is 20% or more, and the phase difference was 177.6 degrees (deg), which is 150 degrees or more and 210 degrees or less. In addition, when each optical characteristic of the phase shift film 2 was measured using a spectroscopic ellipsometer (M-2000D manufactured by J.A. Woollam Company), the refractive index n and the extinction coefficient k of the lower layer 21 for light having a wavelength of 193 nm were 2.93 and 0.24, respectively, and the refractive index n and the extinction coefficient k of the upper layer 22 were 1.92 and 0.04, respectively.

Next, the light-transmissive substrate 1 on which the phase shift film 2 was formed was placed in a single wafer type DC sputtering device, and reactive sputtering (DC sputtering) was performed in a mixed gas atmosphere of argon (Ar), helium (He), and nitrogen (N$_2$) using a chromium (Cr) target. Thus, a light-shielding film (CrN film) 3 made of chromium and nitrogen was formed with a film thickness of 50 nm in contact with the phase shift film 2. A light-shielding film was formed on another light-transmissive substrate under the same conditions, and composition analysis was performed. As a result, Cr:N was 87%:13%.

Next, the light-transmissive substrate 1 on which the light-shielding film (CrN film) 3 was formed was subjected to a heat treatment. After the heat treatment, the optical density at the wavelength (193 nm) of the light of the ArF excimer laser having a stack of the phase shift film 2 and the light-shielding film 3 was measured for the light-transmissive substrate 1 on which the phase shift film 2 and the light-shielding film 3 were layered using a spectrophotometer (Cary 4000 manufactured by Agilent Technologies, Inc.), and it was confirmed that the optical density was 3.0 or more.

Next, the light-transmissive substrate 1 on which the phase shift film 2 and the light-shielding film 3 were layered was placed in a single wafer type RF sputtering device, and the hard mask film 4 configured by silicon, oxygen, and nitrogen was formed with a thickness of 12 nm on the light-shielding film 3 by reactive sputtering (RF sputtering) in a mixed gas atmosphere of argon (Ar), oxygen (02), and nitrogen (N$_2$) using a Si target. Further, a predetermined cleaning treatment was performed to manufacture the mask blank 100 of Example 1.

In addition, the phase shift film of Example 1 was formed on another light-transmissive substrate, subjected to a desired annealing treatment, and then subjected to a predetermined cleaning test (chemical resistance test). After this cleaning test was performed, the presence or absence of film loss was observed for the surface and the side surface of the phase shift film in Example 1. As a result, film loss was hardly observed on the surface nor the side surface, and thus it was found that the phase shift film had sufficient chemical resistance.

[Manufacture of Phase Shift Mask]

Next, in order to confirm that the fine pattern did not collapse, the halftone phase shift mask 200 of Example 1 having the phase shift pattern 2a having a width dimension of 18 nm was manufactured by the following procedure using the mask blank 100 of Example 1. First, the surface of the hard mask film 4 was subjected to HMDS treatment. Subsequently, a resist film made of a chemically amplified resist for electron beam drawing was formed in contact with the surface of the hard mask film 4 by a spin coating method. Next, a first pattern corresponding to a phase shift pattern to be formed on the phase shift film 2 was drawn with electron beam, and predetermined development treatment and cleaning treatment were performed on the resist film to form a resist pattern 5a corresponding to the first pattern (see FIG. 3A).

Next, dry etching using $CF_4$ gas was performed using the resist pattern 5a as a mask to form a hard mask pattern 4a corresponding to the first pattern on the hard mask film 4 (see FIG. 3B).

Next, the resist pattern 5a was removed.

Subsequently, dry etching using a mixed gas of chlorine gas ($Cl_2$) and oxygen gas ($O_2$) was performed using the hard mask pattern 4a as a mask to form a light-shielding pattern 3a corresponding to the first pattern on the light-shielding film 3 (see FIG. 3C).

Next, dry etching was performed using the light-shielding pattern 3a as a mask to form a first pattern (phase shift pattern 2a) on the phase shift film 2, and at the same time, the hard mask pattern 4a was removed (see FIG. 3D). At this time, dry etching was performed on the lower layer 21 using a mixed gas of $BCl_3$ gas and $Cl_2$ gas, and dry etching was performed on the upper layer 22 using dry etching using a fluorine-based gas (a mixed gas of $SF_6$ and He).

Next, a resist film made of a chemically amplified resist for electron beam drawing was formed on the light-shielding pattern 3a by a spin coating method. Next, a second pattern corresponding to a pattern (pattern with a light shielding band pattern) to be formed on the light-shielding film was drawn by exposure on the resist film, and predetermined treatment such as development treatment was further performed to form a resist pattern 6b corresponding to the light-shielding pattern (see FIG. 3E). Subsequently, dry etching using a mixed gas of chlorine gas ($Cl_2$) and oxygen gas ($O_2$) was performed using the resist pattern 6b as a mask to form a second pattern (light-shielding pattern 3b) on the light-shielding film 3 (see FIG. 3F). Furthermore, the resist pattern 6b was removed, and a predetermined treatment such as cleaning was performed to obtain a phase shift mask 200 having a phase shift pattern with a width of 18 nm (see FIG. 3G).

In the phase shift mask 200 of Example 1, collapse of the phase shift pattern 2a was not observed. In addition, when the cross section of the phase shift pattern 2a in the phase shift mask 200 of Example 1 was observed, the cross-sectional shape of the phase shift pattern 2a was favorable, film loss was not observed on either the surface or the side surface of the phase shift pattern 2a, and a favorable phase shift pattern 2a was obtained.

[Evaluation of Pattern Transfer Performance]

The phase shift mask 200 prepared through the above procedure was subjected to simulation of a transfer image to be obtained when a fine pattern of 20 nm is exposed and transferred to a resist film on a semiconductor device with exposure light of a wavelength of 193 nm using AIMS 193 (manufactured by Carl Zeiss AG). Verification of the transferred image by exposure of this simulation showed that the CD in-plane uniformity was high and the design specification was sufficiently satisfied. From this result, it can be said that a circuit pattern finally formed on a semiconductor device can be formed with high accuracy when the phase shift mask 200 of Example 1 is set on a mask stage of an exposure apparatus and a fine pattern of 20 nm is exposed and transferred to a resist film on the semiconductor device.

Example 2

[Manufacture of Mask Blank]

The mask blank 100 of Example 2 was manufactured in the same procedure as in Example 1 except for the phase shift film 2. The phase shift film 2 of Example 2 was formed under different film forming conditions from those of the phase shift film 2 of Example 1. Specifically, first, the thickness of the lower layer 21 of the phase shift film 2 was set to 39 nm. The composition, diffraction intensity, results of power spectrum density analysis, and the like of the lower layer 21 were the same as those in Example 1. Then, an annealing treatment (heat treatment) was performed before the upper layer 22 was formed, and the upper layer 22 including silicon, oxygen, and nitrogen was formed with a thickness of 20 nm on the lower layer 21 on the light-transmissive substrate 1 by reactive sputtering (RF sputtering) in a mixed gas atmosphere of krypton (Kr), oxygen ($O_2$), and nitrogen ($N_2$) using a Si target, and the phase shift film 2 including the lower layer 21 and the upper layer 22 was formed with a thickness of 59 nm. A film of the upper layer was formed on another light-transmissive substrate under the same conditions, and composition analysis was performed. As a result, Si:O:N was 41%:31%:28%, the content of nitrogen was 15 atom % or more and 60 atom % or less, and the content of oxygen was 50 atom % or less.

Next, the light-transmissive substrate 1 on which the phase shift film 2 was formed was subjected to a heat treatment for reducing the film stress of the phase shift film 2. Using a phase shift amount measurement device (MPM193 manufactured by Lasertec Corporation), the transmittance and the phase difference of the phase shift film 2 after the heat treatment with respect to light having a wavelength of 193 nm were measured. As a result, the transmittance was 40.5% and the phase difference was 178.5 degrees (deg). In addition, when each optical characteristic of the phase shift film 2 was measured using a spectroscopic ellipsometer (M-2000D manufactured by J.A. Woollam Company), the refractive index n and the extinction coefficient k of the lower layer 21 for light having a wavelength of 193 nm were 2.93 and 0.24, respectively, and the refractive index n and the extinction coefficient k of the upper layer 22 were 2.10 and 0.10, respectively.

Next, the light-shielding film (CrN film) 3 made of chromium and nitrogen was formed with a film thickness of 50 nm in contact with the phase shift film 2 in the same procedure as in Example 1. For the light-transmissive substrate 1 on which the phase shift film 2 and the light-shielding film 3 of Example 2 were layered, the optical density of a stack of the phase shift film 2 and the light-shielding film 3 at the wavelength (193 nm) of the light of the ArF excimer laser was measured using a spectrophotometer (Cary 4000 manufactured by Agilent Technologies, Inc.), and it was confirmed that the optical density was 3.0 or more.

In addition, the phase shift film of Example 2 was formed on another light-transmissive substrate, and a predetermined cleaning test (chemical resistance test) was performed in the same manner as in Example 1. After this cleaning test was performed, the presence or absence of film loss was observed for the surface and the side surface of the phase shift film in Example 2. As a result, film loss was hardly observed on the surface nor the side surface, and thus it was found that the phase shift film had sufficient chemical resistance.

[Manufacture and Evaluation of Phase Shift Mask]

Next, using the mask blank 100 of Example 2, the phase shift mask 200 of Example 2 having the phase shift pattern 2a with a width of 18 nm was manufactured in the same procedure as in Example 1.

In the phase shift mask 200 of Example 2, collapse of the phase shift pattern 2a was not observed. In addition, when the cross section of the phase shift pattern 2a in the phase shift mask 200 of Example 2 was observed, the cross-sectional shape of the phase shift pattern 2a was favorable, film loss was not observed on either the surface or the side surface of the phase shift pattern 2a, and a favorable phase shift pattern 2a was obtained.

The phase shift mask 200 of Example 2 was, similarly to Example 1, subjected to simulation of a transfer image to be obtained when a fine pattern of 20 nm is exposed and transferred to a resist film on a semiconductor device with exposure light of a wavelength of 193 nm using AIMS 193 (manufactured by Carl Zeiss AG). Verification of the transferred image by exposure of this simulation showed that the CD in-plane uniformity was high and the design specification was sufficiently satisfied. From this result, it can be said that a circuit pattern finally formed on a semiconductor device can be formed with high accuracy when the phase shift mask 200 of Example 2 is set on a mask stage of an exposure apparatus and a fine pattern of 20 nm is exposed and transferred to a resist film on the semiconductor device.

Example 3

[Manufacture of Mask Blank]

The mask blank 100 of Example 3 was manufactured in the same procedure as in Example 1 except for the phase shift film 2. The phase shift film 2 of Example 3 was formed under different film forming conditions from those of the phase shift film 2 of Example 1. Specifically, the phase shift film 2 has a three-layer structure in which the intermediate layer 23 is layered in addition to the lower layer 21 and the upper layer 22. First, the thickness of the lower layer 21 of the phase shift film 2 was set to 41 nm. The composition, diffraction intensity, results of power spectrum density analysis, and the like of the lower layer 21 were the same as those in Example 1. Then, the intermediate layer 23 configured by silicon and oxygen was formed with a thickness of 3 nm on the lower layer 21 on the light-transmissive substrate 1 by sputtering (RF sputtering) in an argon (Ar) gas atmosphere using an $SiO_2$ target. An intermediate layer was formed on another light-transmissive substrate under the same conditions, and composition analysis was performed. As a result, Si:O was 34%:66%, and the total content of silicon and oxygen was 90 atom % or more.

Then, the upper layer 22 configured by silicon, oxygen, and nitrogen was formed with a thickness of 15 nm on the intermediate layer 23 formed on the lower layer 21 on the light-transmissive substrate 1, by reactive sputtering (RF sputtering) in a mixed gas atmosphere of krypton (Kr), oxygen ($O_2$) and nitrogen ($N_2$) using a Si target, and the phase shift film 2 including the lower layer 21, the intermediate layer 23, and the upper layer 22 was formed with a thickness of 59 nm. A film of the upper layer was formed on another light-transmissive substrate under the same conditions, and composition analysis was performed. As a result, Si:O:N was 41%:31%:28%, the content of nitrogen was 15 atom % or more and 60 atom % or less, and the content of oxygen was 50 atom % or less.

Next, the light-transmissive substrate 1 on which the phase shift film 2 was formed was subjected to a heat treatment for reducing the film stress of the phase shift film 2. Using a phase shift amount measurement device (MPM193 manufactured by Lasertec Corporation), the transmittance and the phase difference of the phase shift film 2 after the heat treatment with respect to light having a wavelength of 193 nm were measured. As a result, the transmittance was 40.0% and the phase difference was 178.9 degrees (deg). In addition, when each optical characteristic of the phase shift film 2 was measured using a spectroscopic ellipsometer (M-2000D manufactured by J.A. Woollam Company), the refractive index n and the extinction coefficient k of the lower layer 21 for light having a wavelength of 193 nm were 2.93 and 0.24, respectively, the refractive index n and the extinction coefficient k of the intermediate layer 23 were 1.56 and 0.00, respectively, and the refractive index n and the extinction coefficient k of the upper layer 22 were 2.10 and 0.10, respectively.

Next, the light-shielding film (CrN film) 3 made of chromium and nitrogen was formed with a film thickness of 50 nm in contact with the phase shift film 2 in the same procedure as in Example 1. For the light-transmissive substrate 1 on which the phase shift film 2 and the light-shielding film 3 of Example 3 were layered, the optical density of a stack of the phase shift film 2 and the light-shielding film 3 at the wavelength (193 nm) of the light of the ArF excimer laser was measured using a spectrophotometer (Cary 4000 manufactured by Agilent Technologies, Inc.), and it was confirmed that the optical density was 3.0 or more.

In addition, the phase shift film of Example 3 was formed on another light-transmissive substrate, and a predetermined cleaning test (chemical resistance test) was performed in the same manner as in Example 1. After this cleaning test was performed, the presence or absence of film loss was observed for the surface and the side surface of the phase shift film in Example 3. As a result, film loss was hardly observed on the surface nor the side surface, and thus it was found that the phase shift film had sufficient chemical resistance.

[Manufacture and Evaluation of Phase Shift Mask]

Next, using the mask blank 100 of Example 3, the phase shift mask 200 of Example 3 having the phase shift pattern 2a with a width of 18 nm was manufactured in the same procedure as in Example 1.

In the phase shift mask 200 of Example 3, collapse of the phase shift pattern 2a was not observed. In addition, when the cross section of the phase shift pattern 2a in the phase shift mask 200 of Example 3 was observed, the cross-sectional shape of the phase shift pattern 2a was favorable, film loss was not observed on either the surface or the side surface of the phase shift pattern 2a, and a favorable phase shift pattern 2a was obtained.

The phase shift mask 200 of Example 3 was, similarly to Example 1, subjected to simulation of a transfer image to be obtained when a fine pattern of 20 nm is exposed and transferred to a resist film on a semiconductor device with exposure light of a wavelength of 193 nm using AIMS 193 (manufactured by Carl Zeiss AG). Verification of the transferred image by exposure of this simulation showed that the CD in-plane uniformity was high and the design specification was sufficiently satisfied. From this result, it can be said that a circuit pattern finally formed on a semiconductor device can be formed with high accuracy when the phase shift mask 200 of Example 3 is set on a mask stage of an exposure apparatus and a fine pattern of 20 nm is exposed and transferred to a resist film on the semiconductor device.

Comparative Example 1

[Manufacture of Mask Blank]

A mask blank of Comparative Example 1 was manufactured in the same procedure as in Example 1 except for the phase shift film. A phase shift film of Comparative Example 1 was formed under different film forming conditions from those of the phase shift film 2 of Example 1. Specifically, first, the thickness of a lower layer of the phase shift film was set to 44 nm. The composition of the lower layer was the same as that in Example 1. Then, an annealing treatment (heat treatment) was performed before an upper layer was formed, and the upper layer including silicon, oxygen, and nitrogen was formed with a thickness of 18 nm on the lower layer on the light-transmissive substrate by reactive sputtering (RF sputtering) in a mixed gas atmosphere of krypton (Kr), oxygen ($O_2$), and nitrogen ($N_2$) using a Si target, and the phase shift film 2 including the lower layer and the upper layer was formed with a thickness of 62 nm. A film of the upper layer was formed on another light-transmissive substrate under the same conditions, and composition analysis was performed. As a result, Si:O:N was 34%:56%:10%, and the content of nitrogen did not satisfy 15 atom % or more and 60 atom % or less. In addition, the content of oxygen did not satisfy 50 atom % or less.

Next, the light-transmissive substrate on which the phase shift film was formed was subjected to a heat treatment for reducing the film stress of the phase shift film. Using a phase shift amount measurement device (MPM193 manufactured by Lasertec Corporation), the transmittance and the phase difference of the phase shift film after the heat treatment with respect to light having a wavelength of 193 nm were measured. As a result, the transmittance was 40.5% and the phase difference was 178.5 degrees (deg). In addition, when each optical characteristic of the phase shift film 2 was measured using a spectroscopic ellipsometer (M-2000D manufactured by J.A. Woollam Company), the refractive index n and the extinction coefficient k of the lower layer 21 for light having a wavelength of 193 nm were 2.93 and 0.24, respectively, and the refractive index n and the extinction coefficient k of the upper layer 22 were 1.76 and 0.01, respectively.

Next, the light-shielding film (CrN film) 3 made of chromium and nitrogen was formed with a film thickness of 50 nm in contact with the phase shift film in the same procedure as in Example 1. For the light-transmissive substrate on which the phase shift film and the light-shielding film of Comparative Example 1 were layered, the optical density of a stack of the phase shift film and the light-shielding film at the wavelength (193 nm) of the light of the ArF excimer laser was measured using a spectrophotometer (Cary 4000 manufactured by Agilent Technologies, Inc.), and it was confirmed that the optical density was 3.0 or more.

[Manufacture and Evaluation of Phase Shift Mask]

Next, using the mask blank of Comparative Example 1, a phase shift mask of Comparative Example 1 having a phase shift pattern with a width of 18 nm was manufactured in the same procedure as in Example 1.

In the phase shift mask 200 of Comparative Example 1, collapse of the phase shift pattern 2a was observed. This is presumably caused by the film thickness of the phase shift film excessively increased with respect to the width dimension of the phase shift pattern 2a. From this result, it can be said that it is difficult to form a circuit pattern finally formed on a semiconductor device with high accuracy in a case where the phase shift mask of Comparative Example 1 is set on a mask stage of an exposure apparatus and a fine pattern of 20 nm or less is exposed and transferred to a resist film on the semiconductor device.

What is claimed is:

1. A mask blank comprising:
    a light-transmissive substrate; and
    a phase shift film formed on the light-transmissive substrate, wherein
    the phase shift film includes
        a lower layer containing hafnium and oxygen and
        an upper layer formed on the lower layer and containing silicon, oxygen, and nitrogen,
    a total content of hafnium and oxygen in the lower layer is 95 atom % or more, and
    a content of nitrogen in the upper layer is 15 atom % or more.

2. The mask blank according to claim 1, wherein a content of oxygen in the upper layer is 50 atom % or less.

3. The mask blank according to claim 1, wherein a content of oxygen in the lower layer is 50 atom % or more.

4. The mask blank according to claim 1, wherein a content of nitrogen in the upper layer is 60 atom % or less.

5. The mask blank according to claim 1, wherein
    the phase shift film includes an intermediate layer formed between the lower layer and the upper layer, and
    the intermediate layer consisting of a material having a total content of silicon and oxygen of 90 atom % or more.

6. The mask blank according to claim 5, wherein the intermediate layer consists of silicon and oxygen.

7. The mask blank according to claim 1, wherein film thickness of the phase shift film is 60 nm or less.

8. The mask blank according to claim 1, wherein the phase shift film has a transmittance of 20% or more and a phase shift amount of 150 degrees or more and 210 degrees or less with respect to exposure light of an ArF excimer laser.

9. The mask blank according to claim 1, comprising a light-shielding film on the phase shift film.

10. A phase shift mask comprising:
    a light-transmissive substrate; and
    a phase shift film on which a transfer pattern is formed, the phase shift film being provided on the light-transmissive substrate, wherein
    the phase shift film includes
        a lower layer containing hafnium and oxygen and
        an upper layer formed on the lower layer and containing silicon, oxygen, and nitrogen,
    a total content of hafnium and oxygen in the lower layer is 95 atom % or more, and
    a content of nitrogen in the upper layer is 15 atom % or more.

11. The phase shift mask according to claim 10, wherein a content of oxygen in the upper layer is 50 atom % or less.

12. The phase shift mask according to claim 10, wherein a content of oxygen in the lower layer is 50 atom % or more.

13. The phase shift mask according to claim 10, wherein a content of nitrogen in the upper layer is 60 atom % or less.

14. The phase shift mask according to claim 10, wherein
    the phase shift film includes an intermediate layer formed between the lower layer and the upper layer, and
    the intermediate layer consisting of a material having a total content of silicon and oxygen of 90 atom % or more.

15. The phase shift mask according to claim 14, wherein the intermediate layer consists of silicon and oxygen.

16. The phase shift mask according to claim 10, wherein film thickness of the phase shift film is 60 nm or less.

17. The phase shift mask according to claim 10, wherein the phase shift film has a transmittance of 20% or more and a phase shift amount of 150 degrees or more and 210 degrees or less with respect to exposure light of an ArF excimer laser.

18. The phase shift mask according to claim 10, comprising a light-shielding film on which a light-shielding pattern is formed, the light-shielding film being provided on the phase shift film.

19. A method of manufacturing a semiconductor device, the method comprising transferring, by exposure, the transfer pattern onto a resist film on a semiconductor substrate using the phase shift mask according to claim 10.

* * * * *